US006943621B1

(12) United States Patent
Shuler, Jr.

(10) Patent No.: US 6,943,621 B1
(45) Date of Patent: Sep. 13, 2005

(54) AUTO-ROUTABLE, CONFIGURABLE, DAISY CHAINABLE DATA ACQUISITION SYSTEM

(75) Inventor: Robert L. Shuler, Jr., Friendswood, TX (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 87 days.

(21) Appl. No.: 10/443,234

(22) Filed: May 21, 2003

(51) Int. Cl.[7] .................................................. H03F 1/14
(52) U.S. Cl. ....................... 330/51; 330/124 R; 330/295
(58) Field of Search ........................ 330/51, 53, 124 R, 330/295

(56) References Cited

U.S. PATENT DOCUMENTS

| 4,451,826 | A |   | 5/1984  | Fasching |
|-----------|---|---|---------|----------|
| 4,546,343 | A |   | 10/1985 | Higgins et al. |
| 4,750,111 | A |   | 6/1988  | Crosby, Jr. et al. |
| 4,928,246 | A |   | 5/1990  | Crawley et al. |
| 5,272,476 | A |   | 12/1993 | McArthur et al. |
| 5,745,846 | A | * | 4/1998  | Myer et al. .................. 330/126 |
| 5,973,568 | A | * | 10/1999 | Shapiro et al. ............. 330/295 |
| 6,026,094 | A |   | 2/2000  | Blatter |
| 6,292,053 | B1 | * | 9/2001 | Ke ............................... 330/51 |
| 6,378,018 | B1 |   | 4/2002 | Tsern et al. |
| 6,460,172 | B1 |   | 10/2002 | Insenser Farre et al. |
| 6,529,715 | B1 | * | 3/2003 | Kitko et al. ................. 330/295 |
| 6,553,437 | B1 |   | 4/2003 | Aswell et al. |
| 6,720,812 | B2 |   | 4/2004 | Tumer et al. |
| 6,724,220 | B1 |   | 4/2004 | Snyder et al. |
| 6,775,304 | B1 |   | 8/2004 | Ngo |
| 2003/0074505 | A1 | | 4/2003 | Andreas et al. |

* cited by examiner

Primary Examiner—Khanh V. Nguyen
(74) Attorney, Agent, or Firm—Theodore U. Ro (57) ABSTRACT

A method and apparatus for an acquisition system includes a plurality of sensor input signal lines. At least one of the plurality of sensor input signal lines operatively connects to at least one of a plurality of amplifier circuits. At least one of the plurality of amplifier circuits operatively connects to at least one of a plurality of filter circuits.

24 Claims, 10 Drawing Sheets

AUTO-ROUTABLE, CONFIGURABLE, DAISY CHAINABLE DATA ACQUISITION SYSTEM

ORIGIN OF THE INVENTION

The invention described herein was made by employee(s) of the United States Government and may be manufactured and used by or for the Government of the United States of America for governmental purposes without the payment of any royalties thereon or therefor.

BACKGROUND OF INVENTION

A data acquisition system may be used to obtain, and possibly record, information about an environment. Information obtained from the environment by the data acquisition system may be used to adjust a system operating in or controlling that environment. Typically, one or more sensors are used to sense a condition of the environment. A signal generated by the one or more sensors may need to be amplified and/or filtered by the data acquisition system for proper operation.

In some environments, information from a large number of sensors is desirable. Each sensor typically requires amplification and/or filtering. As the number of sensors increases, so does the required number of amplifier circuits and/or filter circuits. Eventually, a design tradeoff may be required between a physical size of the data acquisition system and a number of amplifier circuits, a complexity of a design of the amplifier circuits, a number of filter circuits, and a complexity of a design of the filter circuits.

The number of amplifier circuits and/or the number of filter circuits may be shared by several sensors at the expense of reducing a speed and/or an availability at which a particular sensor signal may be acquired. The complexity of the design of the amplifier circuits and/or filter circuits may be limited such that more amplifier circuits and/or filter circuits fit within a monolithic integrated circuit and/or the data acquisition system. Additionally, one or more multiplexers may be used to select between several amplifier circuits and/or filter circuits in a data acquisition system.

Figure 1:
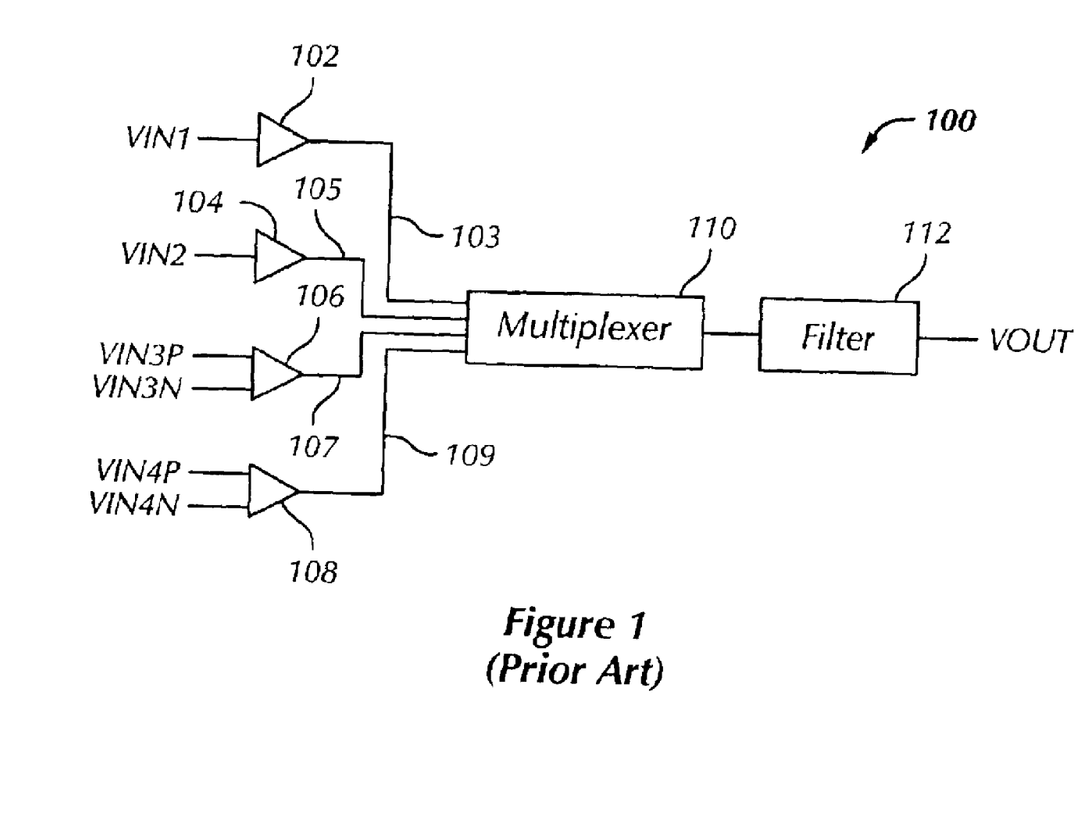
FIG. 1 shows a schematic diagram of a typical data acquisition system.

FIG. 1 shows a schematic diagram of an typical data acquisition system (100). The exemplary data acquisition system (100) includes a plurality of sensor input signal lines (VIN1, VIN2, VIN3P, VIN3N, VIN4P, VIN4N). The sensor input signal lines (VIN1, VIN2) are single ended sensor input signal lines. The sensor input signal lines (VIN3P, VIN3N, VIN4P, VIN4N) are differential sensor input signal lines. The sensor input signal lines VIN3P and VIN3N are positive and negative sensor input signal lines, respectively, from a sensor. The sensor input signal lines VIN4P and VIN4N are positive and negative sensor input signal lines, respectively, from another sensor.

The plurality of sensor input signal lines (VIN1, VIN2, VIN3P, VIN3N, VIN4P, VIN4N) are amplified by amplifier circuits (102, 104, 106, 108). Each single ended sensor input signal line (VIN1, VIN2) is amplified by an amplifier circuit (102, 104, respectively). Each differential sensor input signal line (VIN3P and VIN3N, VIN4P and VIN4N) is amplified by a differential amplifier circuit (106, 108, respectively). An output signal line (103, 105, 107, 109) from each amplifier circuit (102, 104, 106, 108) is received by a multiplexer (110). The multiplexer (110) selects one of the output signal lines (103, 105, 107, 109) to be received by a filter circuit (112). The filter circuit (112) filters the amplified sensor input signal line selected by the multiplexer (110) and outputs a signal on a VOUT signal line.

The arrangement of the data acquisition system (100) allows multiple sensor input signal lines (VIN1, VIN2, VIN3P, VIN3N, VIN4P, VIN4N) to be received and allows several different types of input signal lines (i.e., single ended and differential) to be received. In this example, a design tradeoff has been made to favor the number and types of input signal lines by reducing the number of filter circuits (112).

When a signal from a particular sensor input signal line is desired, a delay may result because the multiplexer (110) may need to select a different output signal line (103, 105, 107, or 109) and the filter circuit (112) may need to settle before an accurate signal is output on the VOUT signal line. Also, only one sensor input signal line(s), or channel, may be output at any given time.

With respect to a design of the data acquisition system (100), the output signal lines (103, 105, 107, 109) are all routed to the multiplexer (110). The routing may require hand layout and routing because an analog signal may be susceptible to noise created by adjacent signal lines in the routing. Also, if the data acquisition system (100) is disposed on a monolithic integrated circuit, and additional monolithic integrated circuits are added, more channels may be amplified and filtered; however, additional circuitry, external of the monolithic integrated circuits, may be required to acquire the signals from the plurality of VOUT signal lines.

SUMMARY OF INVENTION

According to one aspect of one or more embodiments of the present invention, the present invention relates to a data acquisition system comprising a plurality of sensor input signal lines; a plurality of amplifier circuits where at least one of the plurality of amplifier circuits operatively connects to at least one of the plurality of sensor input signal lines; and a plurality of filter circuits where at least one of the plurality of filter circuits is an analog, multiple pole filter circuit and where at least one of the plurality of filter circuits operatively connects to at least one of the plurality of amplifier circuits.

According to one aspect of one or more embodiments of the present invention, the present invention relates to a data acquisition system comprising a first integrated circuit comprising a plurality of sensor input signal lines, a daisy chained input control signal line, a daisy chained output control signal line, an input signal line, an output signal line, and a control signal line; and a second integrated circuit comprising a plurality of sensor input signal lines, a daisy chained input control signal line, a daisy chained output control signal line, an input signal line, an output signal line, and a control signal line where the daisy chained output control signal line of the first integrated circuit operatively connects to the daisy chained input control signal line of the second integrated circuit where the output signal line of the second integrated circuits operatively connects to the input signal line of the first integrated circuit where the control signal line operatively connects to both the first integrated circuit and the second integrated circuit and where the input signal line of the first integrated circuit is responsive to at least one of the plurality of sensor input signal lines of the second integrated circuit dependent on the daisy chained output control signal line of the first integrated circuit.

According to one aspect of one or more embodiments of the present invention, the present invention relates to a method of acquiring data comprising inputting a plurality of sensor signals; amplifying the plurality of sensor signals to produce a plurality of amplified sensor signals; filtering the plurality of amplified sensor signals where the filtering uses a plurality of analog, multiple pole filter circuits and where the filtering produces a first filtered, amplified sensor signal, a second filtered, amplified sensor signal, and a third filtered, amplified sensor signal; a first selecting between the first filtered, amplified sensor signal and an input signal dispose on an integrated circuit input signal line to output a first output signal; a second selecting between the second filtered, amplified sensor signal and a first signal dependent on the first output signal to output a second output signal; a third selecting between the third filtered, amplified sensor signals and a second signal dependent on the second output signal to output a third output signal; and operatively connecting the third output signal to an integrated circuit output signal line.

According to one aspect of one or more embodiments of the present invention, the present invention relates to a data acquisition system comprising means for inputting a plurality of sensor signals; means for amplifying the plurality of sensor signals to produce a plurality of amplified sensor signals; means for filtering the plurality of amplified sensor signals to produce a plurality of filtered, amplified sensor signals; means for selecting one of the plurality of filtered, amplified sensor signals from a first integrated circuit to produce a selected filtered, amplified sensor signal; means for daisy chaining the selected filtered, amplified sensor signal to a second integrated circuit; and means for outputting the selected filtered, amplified sensor signal from the second integrated circuit.

According to one aspect of one or more embodiments of the present invention, the present invention relates to a data acquisition system comprising a first integrated circuit comprising means for inputting a sensor signal for at least three channels; and means for filtering each of the at least three channels where the means for filtering comprises one or more poles and where each of the at least three channels is dependent on at least one of the means for filtering.

Other aspects and advantages of the invention will be apparent from the following description and the appended claims.

DETAILED DESCRIPTION

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the present invention relate to a data acquisition system arranged so that a plurality of monolithic integrated circuits may be used. In one or more embodiments, each monolithic integrated circuit includes a plurality of channels where each channel supports at least one sensor input signal line. Each channel includes at least one filter where the filter has one or more poles.

An output signal line from one of the filter circuits of a first monolithic integrated circuit may be daisy chained to an input signal line of a second monolithic integrated circuit. Furthermore, an output control signal on an output control signal line of the second monolithic integrated circuit may be daisy chained to an input control signal line of the first monolithic integrated circuit.

One of ordinary skill in the art will understand that a daisy chained signal may be received by a first circuit, and an output signal of the first circuit may be received by a second circuit where the output signal of the first circuit effectively controls a similar functionality as the signal received by the first circuit. In other words, a signal is not directly routed to a plurality of circuits. Instead, a signal is received by a first circuit that then controls a similar functionality of a second circuit, possibly dependent on a state of the first circuit.

Figure 2:
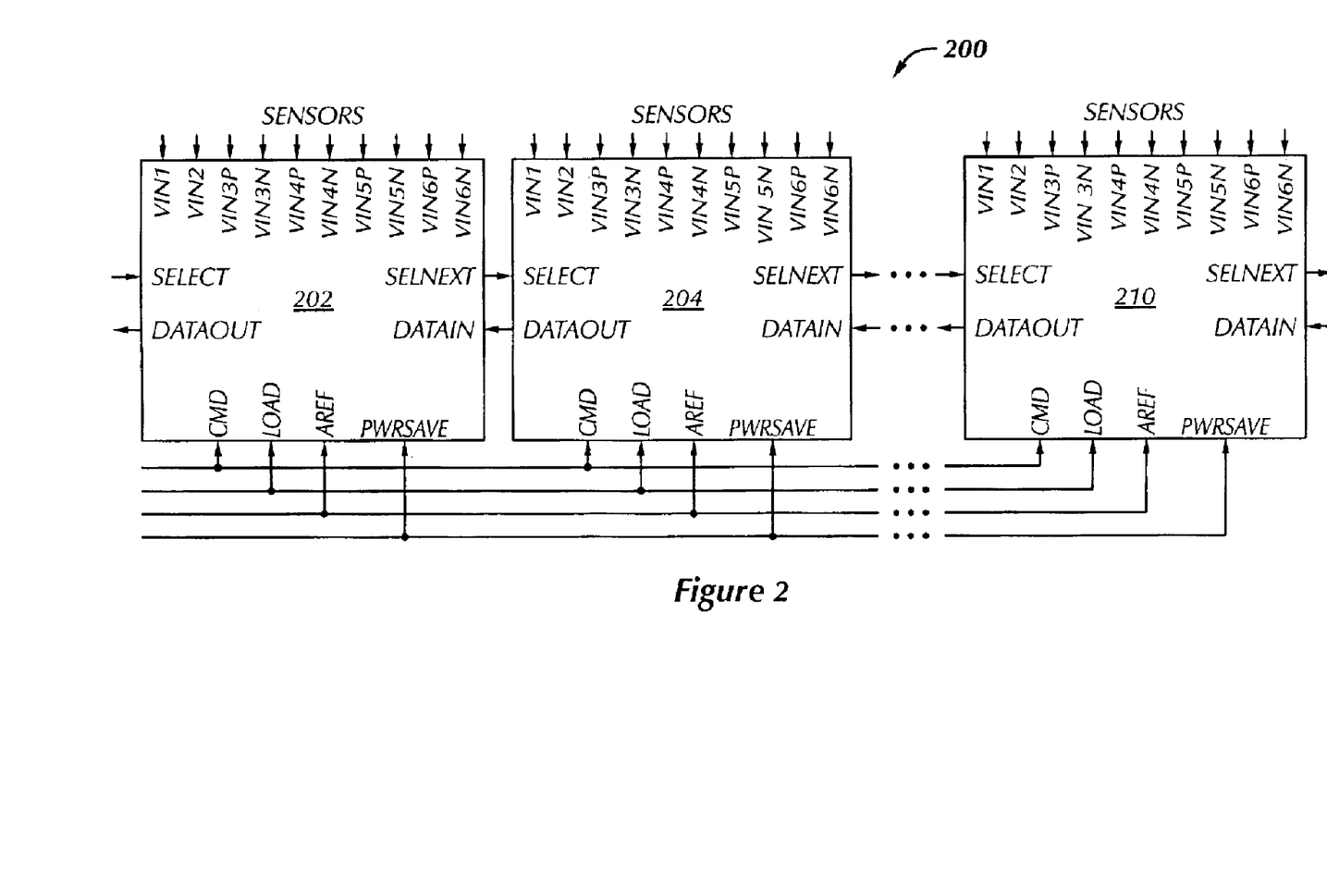
FIG. 2 shows a schematic diagram of a data acquisition system in accordance with an embodiment of the present invention.

FIG. 2 shows a schematic diagram of a data acquisition system (200) in accordance with an embodiment of the present invention. The data acquisition system (200) includes a plurality of monolithic integrated circuits (202, 204, 210).

Each monolithic integrated circuits (202, 204, 210) is similarly arranged.

Each monolithic integrated circuits (202, 204, 210) includes a plurality of sensor input signal lines (VIN1, VIN2, VIN3P, VIN3N, VIN4P, VIN4N, VIN5P, VIN5N, VIN6P, VIN6N). The sensor input signal lines (VIN1, VIN2) are single ended sensor input signal lines. The sensor input signal lines (VIN3P, VIN3N, VIN4P, VIN4N, VIN5P, VIN5N VIN6P, VIN6N) are differential sensor input signal lines. The sensor input signal lines VIN3P, VIN4P, VIN5P, and VIN6P are positive sensor input signal lines and sensor input signal lines VIN3N, VIN4N, VIN5N, and VIN6N are negative sensor input signal lines, respectively, from one or more sensors.

Each single ended sensor input signal line (VIN1, VIN2) and differential sensor input signal lines (VIN3P and VIN3N, VIN4P and VIN4N, VIN5P and VIN5N, VIN6P and VIN6N) are amplified by an amplifier circuit and filtered by a filter circuit. Each filter circuit may be an analog, multiple pole filter circuit. In other words, each channel is amplified and filtered.

Monolithic integrated circuit (202) receives a SELECT signal disposed on a daisy chained input control signal line.

The SELECT signal may select a filtered, amplified sensor signal (or channel) from one of the plurality of sensor input signal lines to be output on a DATAOUT output signal line. Furthermore, the SELECT signal may be daisy chained on the monolithic integrated circuit (202) as a SELNEXT signal disposed on a daisy chained output control signal line. The daisy chained output control signal line of the monolithic integrated circuit (202) may operatively connect to a daisy chained input control signal line of the monolithic integrated circuit (204).

The SELECT signal may select a filtered, amplified sensor signal (or channel) from one of the plurality of sensor input signal lines on the monolithic integrated circuit (204) to be output on a DATAOUT output signal line of the monolithic integrated circuit (204). The DATAOUT output signal line of the monolithic integrated circuit (204) may be daisy chained to a DATAIN input signal line of the monolithic integrated circuit (202). Accordingly, the DATAOUT output signal line of the monolithic integrated circuit (202) carries an amplified, filtered sensor signal originated on the monolithic integrated circuit (204).

One of ordinary skill in the art, having benefit of this disclosure, will understand that a plurality of similarly arranged monolithic integrated circuits may be daisy chained so that a daisy chained control signal (e.g., SELECT signal) may select at least one of many sensor input signal lines, and daisy chain an amplified, filtered sensor signal through the plurality of similarly arranged monolithic integrated circuits to a desired output signal line.

Other control signal lines, for example, digital control signal lines CMD, LOAD, and PWRSAVE, may connect to each of the plurality of monolithic integrated circuits (202, 204, 210). Also, an analog reference voltage potential AREF on an analog control signal line may connect to each of the plurality of monolithic integrated circuits (202, 204, 210). Accordingly, some control signal lines may not be daisy chained between the plurality of monolithic integrated circuits (202, 204, 210).

One of ordinary skill in the art, having benefit of this disclosure, will understand that a single monolithic integrated circuit (202, 204, or 210) may be used in a data acquisition system. Furthermore, a large number of monolithic integrated circuit (202, 204, 210) may be used depending on a number of sensor signal lines desired. The monolithic integrated circuit (202, 204, 210) may include CMOS transistors.

Figure 3:
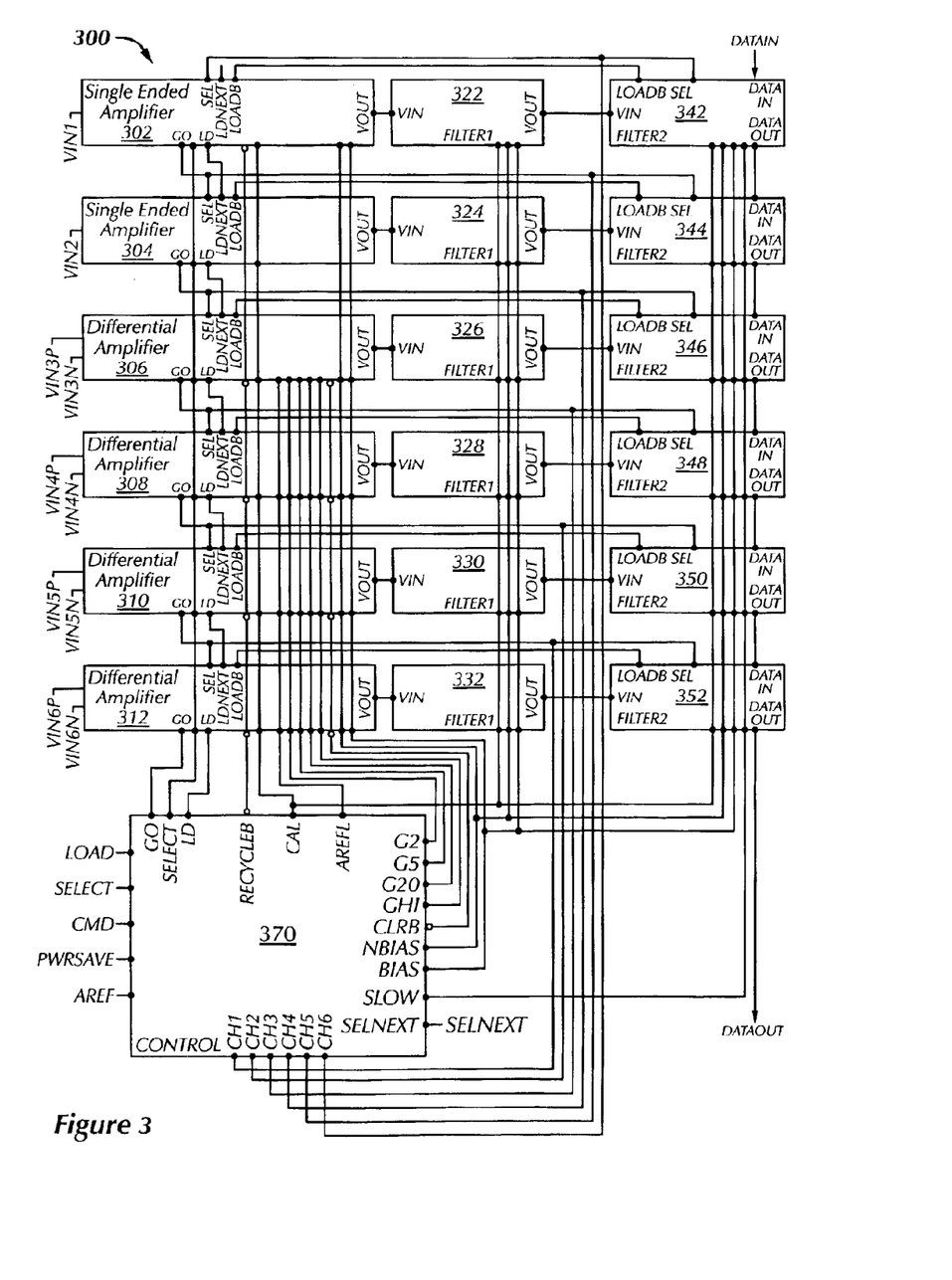
FIG. 3 shows a schematic diagram of a data acquisition system in accordance with an embodiment of the present invention.

FIG. 3 shows a schematic diagram of an data acquisition system (300) in accordance with an embodiment of the present invention. The exemplary data acquisition system (300) may be disposed on a single monolithic integrated circuit. Also, the data acquisition system (300) may use discrete components. Furthermore, the data acquisition system (300) may be disposed on a plurality of monolithic integrated circuits.

The exemplary data acquisition system (300) includes a control circuit (370) that controls various functionalities within other circuits in the data acquisition system (300). A plurality of sensor input signal lines (VIN1, VIN2, VIN3P, VIN3N, VIN4P, VIN4N, VIN5P, VIN5N, VIN6P, VIN6N). The sensor input signal lines (VIN1, VIN2) are single ended sensor input signal lines. The sensor input signal lines (VIN3P, VIN3N, VIN4P, VIN4N, VIN5P, VIN5N VIN6P, VIN6N) are differential sensor input signal lines. The sensor input signal lines VIN3P, VIN4P, VIN5P, and VIN6P are positive sensor input signal lines and sensor input signal lines VIN3N, VIN4N, VIN5N, and VIN6N are negative sensor input signal lines, respectively, from one or more sensors.

Each single ended sensor input signal line (VIN1, VIN2) and differential sensor input signal lines (VIN3P and VIN3N, VIN4P and VIN4N, VIN5P and VIN5N, VIN6P and VIN6N) are amplified by an amplifier circuit (302, 304, 306, 308, 310, 312). The amplifier circuit (312) receives a GO control signal from the control circuit (370). The SEL control signal output from the amplifier circuit (312) is received as a GO control signal by the amplifier circuit (310). The GO control signal and SEL control signal are daisy chained between each of the amplifier circuits (302, 304, 306, 308, 310, 312).

The SELECT signal received by each of the amplifier circuits (302, 304, 306, 308, 310, 312) and the daisy chained GO control signal and SEL control signal select one channel to respond to commands. Accordingly, a selected channel may adjust gain values for the amplifier circuits (306, 308, 310, 312). Also, the selected channel may output an output signal on a DATAOUT output signal line. Furthermore, the control circuits (370) outputs a SELNEXT signal that may also be used as a SELECT signal received by a control circuit in another, similarly arranged data acquisition system (300).

Gain signals (G2, G5, G20, and GHI) are output from the control circuit (370). The gain signals (G2, G5, G20, and GHI) control an amount of gain provided by the amplifier circuits (306, 308, 310, 312). Amplifier circuits (302, 304) have a fixed unity gain.

A calibration signal CAL is connected to each of the amplifier circuits (302, 304, 306, 308, 310, 312). The calibration signal CAL may be used to allow an offset voltage potential on at least one of the plurality of sensor input signal lines (VIN1, VIN2, VIN3P, VIN3N, VIN4P, VIN4N, VIN5P, VIN5N, VIN6P, VIN6N) to be calibrated. The offset voltage potential may be calibrated using a selected amplifier circuits (302, 304, 306, 308, 310, or 312). A calibration for all of the plurality of sensor input signal lines (VIN1, VIN2, VIN3P, VIN3N, VIN4P, VIN4N, VIN5P, VIN5N, VIN6P, VIN6N) may occur by calibrating each of the amplifier circuits (302, 304, 306, 308, 310, 312) in turn.

Each amplifier circuits (302,304, 306, 308, 310, 312) outputs an output signal VOUT responsive to the sensor input signal lines (VIN1, VIN2, VIN3P, VIN3N, VIN4P, VIN4N, VIN5P, VIN5N, VIN6P, VIN6N). The output signal VOUT from each of the amplifier circuits (302, 304, 306, 308, 310, 312) is received by the first of two filter circuits (322, 324, 326, 328, 330, 332). The filter circuits (322, 324, 326, 328, 330, 332) filter the output signal VOUT from each of the amplifier circuits (302, 304, 306, 308, 310, 312). The filter circuits (322, 324, 326, 328, 330, 332) outputs an output signal VOUT to the second of two filter circuits (342, 344, 346, 348, 350, 352). A cutoff frequency of the second of two filter circuits (342, 344, 346, 348, 350, 352) is controlled by the signal SLOW generated by the control circuit (370). A gain of the amplifier circuits (302, 304, 306, 308, 310, 312) and/or a cutoff frequency of any of the filter circuits (322, 324, 326, 328, 330, 332, 342, 344, 346, 348, 350, 352) may be controlled by a control memory that may be located at anywhere within or external to the data acquisition system (300).

The combined first of two filter circuits (322, 324, 326, 328, 330, 332) and the second of two filter circuits (342, 344, 346, 348, 350, 352), respectively, provide an analog, multiple pole filter circuit for each of the channels.

In one or more embodiments of the present invention, each channel is amplified and filtered. One channel may be output at any given time. Each of the second of two filter circuits (342, 344, 346, 348, 350, 352) includes a DATAIN input signal line and a DATAOUT output signal line. Dependent on the control circuit (370), one of the channels may be selected. For any channel that is not selected, the signal received on the DATAIN input signal line is output on the DATAOUT output signal line. Furthermore, the DATAIN input signal line operatively connected to the filter circuit (342) may be provided by another, similarly arranged data acquisition system (300).

For the channel that is selected, a filtered output signal from the second of two filter circuits (342, 344, 346, 348, 350, or 352) is output on the DATAOUT output signal line. Accordingly, the DATAOUT output signal line from the filter circuit (352) carries the filtered output signal from any selected channel. The DATAOUT output signal may be provided to another, similarly arranged data acquisition system (300).

One of ordinary skill in the art, having benefit of this disclosure, will understand that each of the second of two filter circuits (342, 344, 346, 348, 350, 352) may include a switch circuit (i.e., output multiplexing switch). The switch circuit in each of the second of two filter circuits (342, 344, 346, 348, 350, 352) may select between the DATAIN input signal line and a local filtered output signal. A plurality of the second of two filter circuits (342, 344, 346, 348, 350, 352) may be arranged so that one filtered output signal is selected and the other of the second of two filter circuits (342, 344, 346, 348, 350, 352) transport the filtered output signal to a desired output signal line (e.g., DATAOUT output signal line). The switch circuit in each of the second of two filter circuits (342, 344, 346, 348, 350, 352) may be responsive to a daisy chained control signal line (e.g., SEL control signal line).

One of ordinary skill in the art, having benefit of this disclosure, will understand that the data acquisition system (300) may be arranged to have a switch circuit (i.e., output multiplexing switch) that selects a filter circuit output and/or an amplifier circuit output.

In one or more embodiments of the present invention, each channel is active. Accordingly, the amplifier circuits (302, 304, 306, 308, 310, 312) are not switched, which reduces noise. Because noise and analog circuit effects are considered, at least one of the amplifier circuits (302, 304, 306, 308, 310, 312) and/or at least one of the filter circuits (322, 324, 326, 328, 330, 332, 342, 344, 346, 348, 350, 352) may be auto-routed.

In a typical analog circuit design, matching between analog circuit elements is critical for proper operation of the analog circuit. In one or more embodiments of the present invention, bias signals (e.g., BIAS, NBIAS) are transmitted as voltages. Accordingly, current mirrors, and other analog bias circuits, may be distributed across the data acquisition system (300). Furthermore, parts of a current mirror, and other analog bias circuits, may be split and distributed across the data acquisition system (300). Accordingly, it is practical that at least one of the amplifier circuits (302, 304, 306, 308, 310, 312) and/or at least one of the filter circuits (322, 324, 326, 328, 330, 332, 342, 344, 346, 348, 350, 352) may be auto-routed.

The data acquisition system (300) may include CMOS transistors. Other signal lines that are shown, but not described in FIG. 3, will become apparent as other figures are described.

Figure 4:
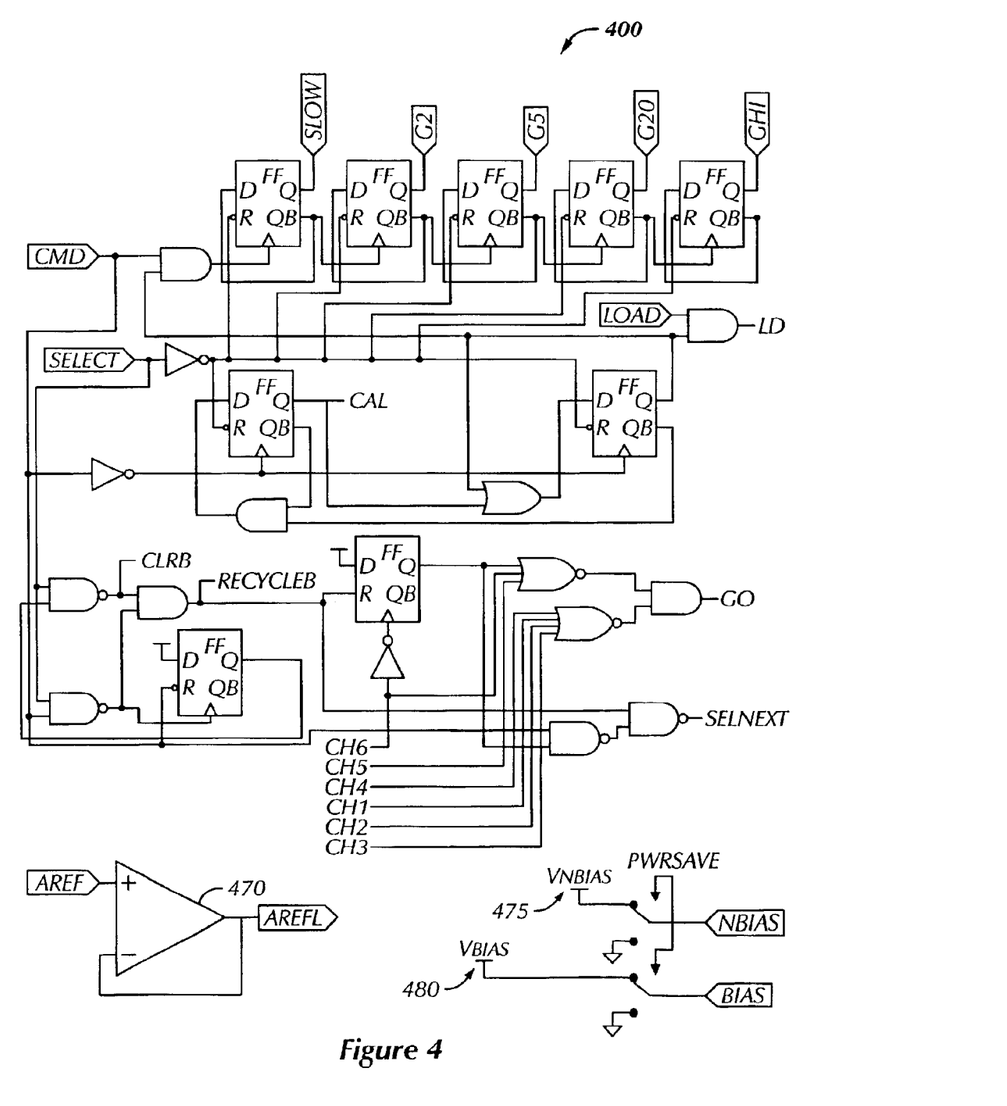
FIG. 4 shows a schematic diagram of a control circuit in accordance with an embodiment of the present invention.

FIG. 4 shows a schematic diagram of a control circuit (400) in accordance with an embodiment of the present invention. The exemplary control circuit (400) may be used as the control circuit (370) shown in FIG. 3. The control circuit (400) receives a LOAD signal, SELECT signal, CMD signal, PWRSAVE signal, and AREF signal. The LOAD signal, SELECT signal, CMD signal, and PWRSAVE signal are digital signals that may remain at a fixed logic state or user controlled using a number of digital pulses. The AREF signal is an analog reference signal.

The LOAD signal, for example, may be fixed at a logic high state. The SELECT signal and CMD signal may have a number of logical high pulses at user selected times to input commands to the control circuit (400). For example, dependent on a logic circuit arrangement, the following table of input signals may have the listed results.

| Command | Operation |
| --- | --- |
| Master Clear | Two SELECT pulses while CMD high |
| Recycle to Start | CMD pulse while SELECT high |
| Select channel N | N SELECT pulses from Recycle or Master Clear |
| Load | Transfer command register to selected channel (may be fixed at a logical high) |
| After Channel Select | |
| Number of CMD pulses = 1 | Read channel |
| Number of CMD pulses = 2 | Read offset voltage potential (calibration) |
| Number of CMD pulses = 3+ | Gain = 1, 2, 5, 10, 20, 40, 100, 200, u, u, u, u, 400, u, u, u (u = undefined) (First CMD pulse activates filter (SLOW active), next CMD pulse sets gain = 2 (SLOW inactive), next CMD pulse sets gain = 2 (SLOW active), next CMD pulse sets gain = 5 (SLOW inactive), next CMD pulse sets gain = 5 (SLOW active), etc.) |

In one or more embodiments of the present invention, after the control circuit (400) is cleared, a channel may be selected. Channels are selected dependent on signals carried by a SELECT signal line (shown in FIG. 3) routed to all the amplifier circuits (302, 304, 306, 308, 310, 312) and daisy chaining the GO signal and SEL control signal between the amplifier circuits (302, 304, 306, 308, 310, 312). The initial GO signal is shown in FIG. 4.

If a number of SELECT signals exceeds a number of channels within the data acquisition system (300 shown in FIG. 3), the SELNEXT signal may select a channel in a next, similarly arranged data acquisition system (300 shown in FIG. 3). The SEL control signal from each channel is received by the control circuit (400) as signals CH1, CH2, CH3, CH4, CH5, and CH6. When the CH6 transitions to an active state, the next SELECT signal causes the SELNEXT signal to become active. The SELNEXT signal acts as the SELECT signal for the next, similarly arranged data acquisition system (300 shown in FIG. 3).

In one or more embodiments of the present invention, after the control circuit (400) is cleared and a channel selected, the CMD signal may be pulsed to input commands to the control circuit (400). The CMD signal is used to clock two flip flops, which active a calibration signal CAL on the second pulse. The calibration signal CAL allows an offset voltage potential on at least one of the plurality of sensor input signal lines (VIN1, VIN2, VIN3P, VIN3N, VIN4P, VIN4N, VIN5P, VIN5N, VIN6P, VIN6N shown in FIG. 3) to be calibrated. A third pulse of the CMD signal deactivates the calibration signal CAL.

In one or more embodiments of the present invention, the CMD signal may continue to be pulsed after calibration. The third CMD signal pulse causes the SLOW signal to become active, which changes a cutoff frequency of the selected filter circuit (342, 344, 346, 348, 350, or 352) shown in FIG. 3. The fourth CMD signal pulse causes the SLOW signal to become inactive and increases a default gain of unity to a gain of two for the amplifier circuits (306, 308, 310, 312) shown in FIG. 3. The fifth CMD signal pulse causes the SLOW signal to become active again and maintains the gain of two for the amplifier circuits (306, 308, 310, 312) shown in FIG. 3. The sixth CMD signal pulse causes the SLOW signal to become inactive and increases gain of two to a gain of five for the amplifier circuits (306, 308, 310, 312) shown in FIG. 3. The above pattern continues according to the logic shown in FIG. 4. The gain may be switched dependent on a user command.

In one or more embodiments of the present invention, when two SELECT signal pulses occur while the CMD signal is logic high, a CLRB signal is pulsed, which resets all the gain settings in the amplifier circuits (306, 308, 310, 312).

Also, if the CMD signal pulses while the SELECT signal is logic high, the flip flops within the control circuit (400) are reset, and a RECYCLEB signal is transmitted to reset the select logic within the amplifier circuits (302, 304, 306, 308, 310, 312).

An analog reference voltage potential AREF on an analog control signal line is buffered in the control circuit (400) by a unity gain operational amplifier (470) to generate a local analog reference voltage potential AREFL. The PWRSAVE signal selectively switches an NBIAS signal and a BIAS signal between a voltage source (475, 480), respectively, and reference voltage (e.g., a ground voltage potential). Selectively switching to the reference voltage reduces the power consumed by circuits operatively connected to the NBIAS signal and the BIAS signal.

One or ordinary skill in the art will understand that the control circuit (400) and control signal lines provide one or many possible arrangements. A control circuit that operates in a different manner but achieves an equivalent functionality should be construed to be within the scope of the present invention. Furthermore, digital signals may be active as either a logic high or logic low signal. Circuits may be designed that function as above using an opposite state. Furthermore, different circuitry may be designed that operates in a different manner but achieves an equivalent functionality. The different circuitry should be construed to be within the scope of the present invention.

Figure 5:
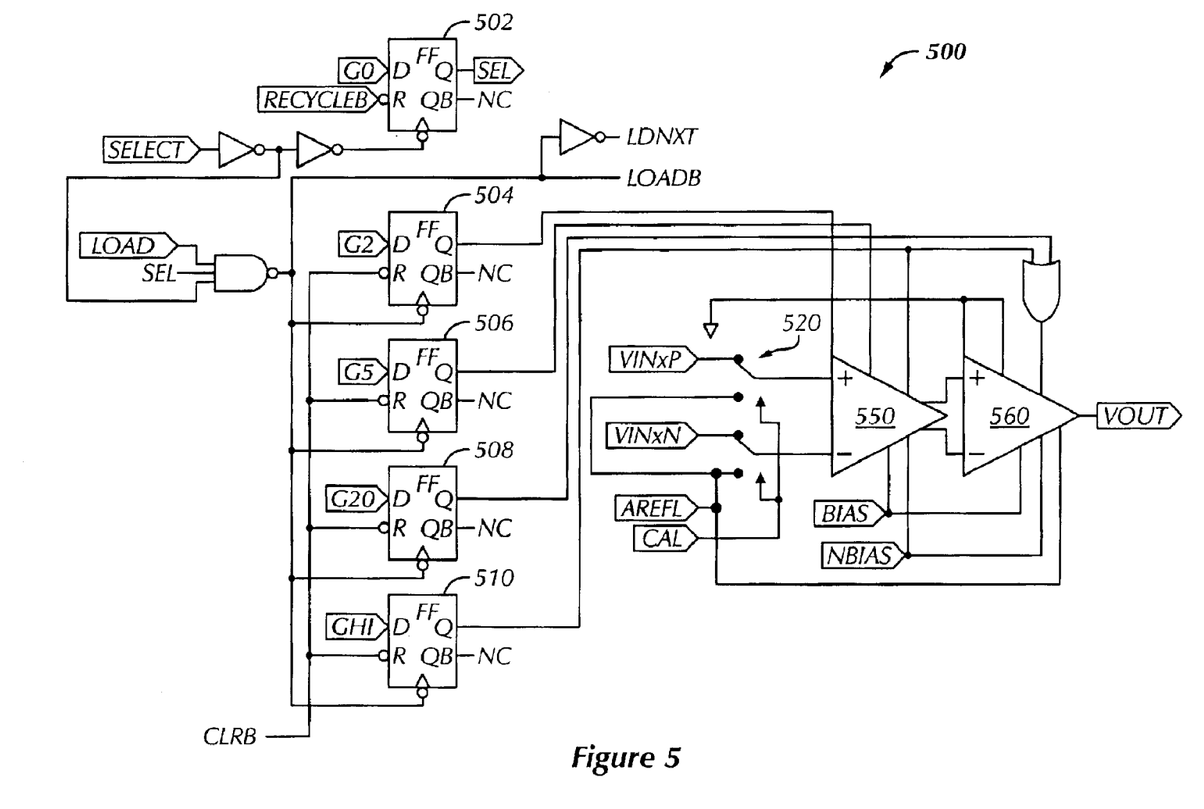
FIG. 5 shows a schematic diagram of a two-stage differential amplifier circuit with gain control memory in accordance with an embodiment of the present invention.

FIG. 5 shows a schematic diagram of a two-stage differential amplifier circuit with gain control memory (500) in accordance with an embodiment of the present invention. The exemplary two-stage differential amplifier circuit with gain control memory (500) may be used as the amplifier circuit (306, 308, 310, 312) shown in FIG. 3. A calibration signal CAL may be used to allow an offset voltage potential on at least one of the plurality of sensor input signal lines (VIN3P, VIN3N, VIN4P, VIN4N, VIN5P, VIN5N, VIN6P, VIN6N shown in FIG. 3) to be calibrated. The calibration signal CAL selects whether a switch circuit connects at least one of the plurality of sensor input signal lines (VIN3P, VIN3N, VIN4P, VIN4N, VIN5P, VIN5N, VIN6P, VIN6N shown in FIG. 3) or a local analog reference voltage potential AREFL to the inputs of a differential amplifier circuit (550).

The differential amplifier circuit (550) operatively connects to a second differential amplifier circuit (560). Gain signals (G2, G5, G20, and GHI) are distributed between the differential amplifier circuits (550, 560). Each of the differential amplifier circuits (550, 560) may provide a portion of any final gain achieved by the differential amplifier circuits (550, 560).

Flip flop (502) maintains a local state for a selection circuitry. The flip flop (502) also propagates the daisy chained SEL control signal from one amplifier circuit (302, 304, 306, 308, 310, 312) to another amplifier circuit (302, 304, 306, 308, 310, 312). Flip flops (504, 506, 508, 510) maintain a local state for the gain control memory circuitry. The flip flops (504, 506, 508, 510) may have a gain other than a default unity gain after a Master Clear or Recycle to Start command if the channel is selected and programmed with a different gain.

Figure 6:
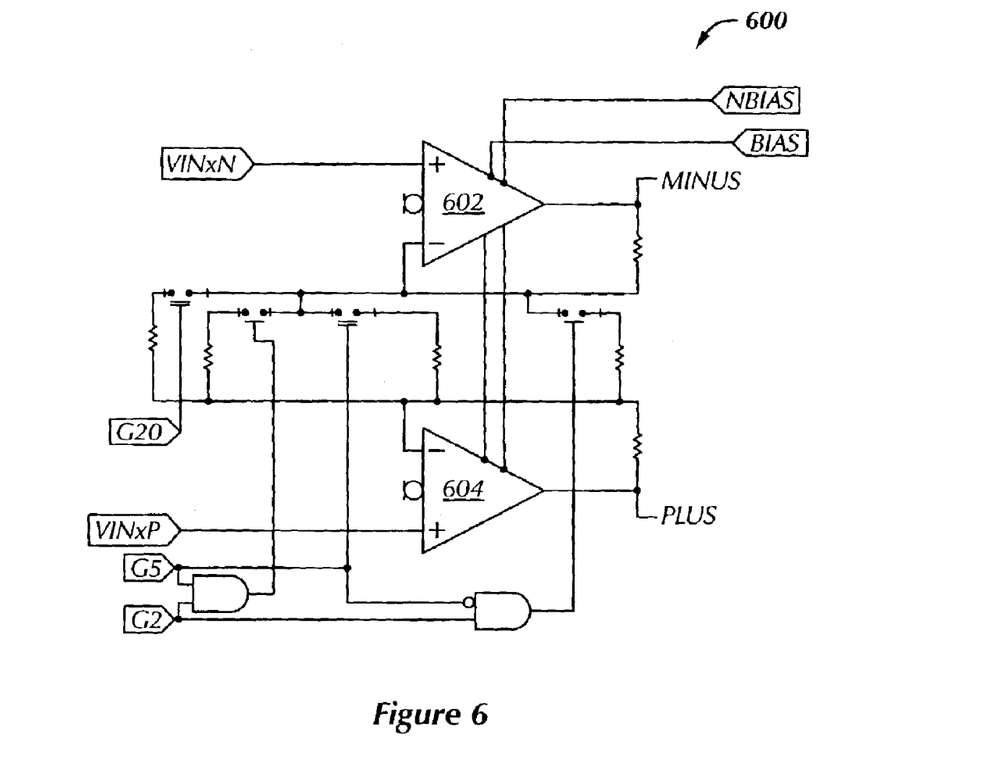
FIG. 6 shows a schematic diagram of a first differential amplifier circuit in accordance with an embodiment of the present invention.

FIG. 6 shows a schematic diagram of a first differential amplifier circuit (600) in accordance with an embodiment of the present invention. The exemplary first differential amplifier circuit (600) may be used as the differential amplifier circuit (550) shown in FIG. 5.

The first differential amplifier circuit (600) includes a plurality of switches that are controlled by gain signals (G2, G5, and G20). The gain signals (G2, G5, and G20) may be operatively connected to gain signals external of the first differential amplifier circuit (600) that represent different gain values than implied by the labels. The plurality of switches determine which resistors, and consequently which resistor values, are operatively connected to operational amplifiers (602, 604). A gain of the first differential amplifier circuit (600) is responsive to the resistor values determined by the plurality of switches. A BIAS signal and NBIAS signal provide a bias signal to the operational amplifiers (602, 604).

Figure 7:
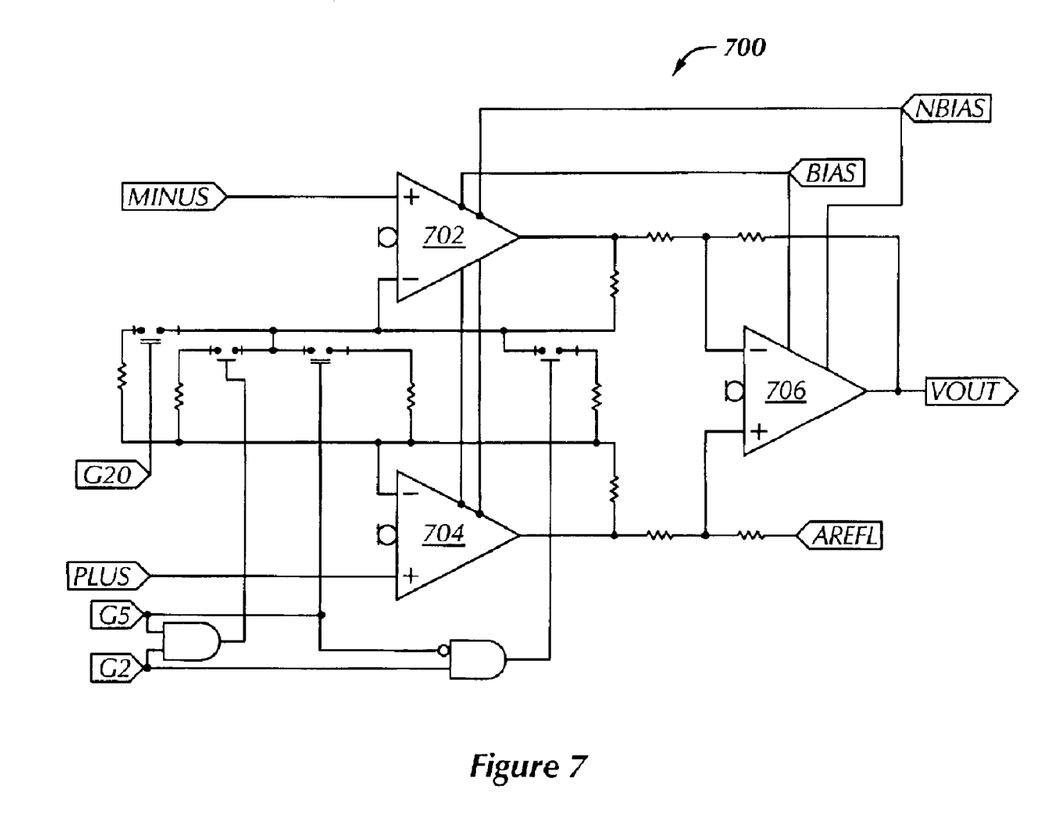
FIG. 7 shows a schematic diagram of a second differential amplifier circuit with conversion to a single ended output in accordance with an embodiment of the present invention.

FIG. 7 shows a schematic diagram of a second differential amplifier circuit with conversion to a single ended output (700) in accordance with an embodiment of the present invention. The exemplary second differential amplifier circuit with conversion to a single ended output (700) may be used as the differential amplifier circuit (560) shown in FIG. 5. The second differential amplifier circuit with conversion to a single ended output (700) includes a plurality of switches that are controlled by gain signals (G2, G5, and G20). The gain signals (G2, G5, and G20) may be operatively connected to gain signals external of the second differential amplifier circuit with conversion to a single ended output (700) that represent different gain values than implied by the labels. The plurality of switches determine which resistors, and consequently which resistor values, are operatively connected to operational amplifiers (702, 704). A gain of the second differential amplifier circuit with conversion to a single ended output (700) is responsive to the resistor values determined by the plurality of switches.

The second differential amplifier circuit with conversion to a single ended output (700) converts a differential input to a single ended output VOUT using operational amplifier (706). The single ended output VOUT is representative of the output signal VOUT shown in the amplifier circuits (306, 308, 310, 312) shown in FIG. 3 and the differential amplifier circuit (560) shown in FIG. 5. A local analog reference voltage potential AREFL is operatively connected to an input terminal of the operational amplifier (706). The local analog reference voltage potential AREFL may be used as a means to adjust an offset voltage potential of the differential amplifier circuit (500) shown in FIG. 5. A BIAS signal and NBIAS signal provide a bias signal to the operational amplifiers (702, 704, 706).

Figure 8:
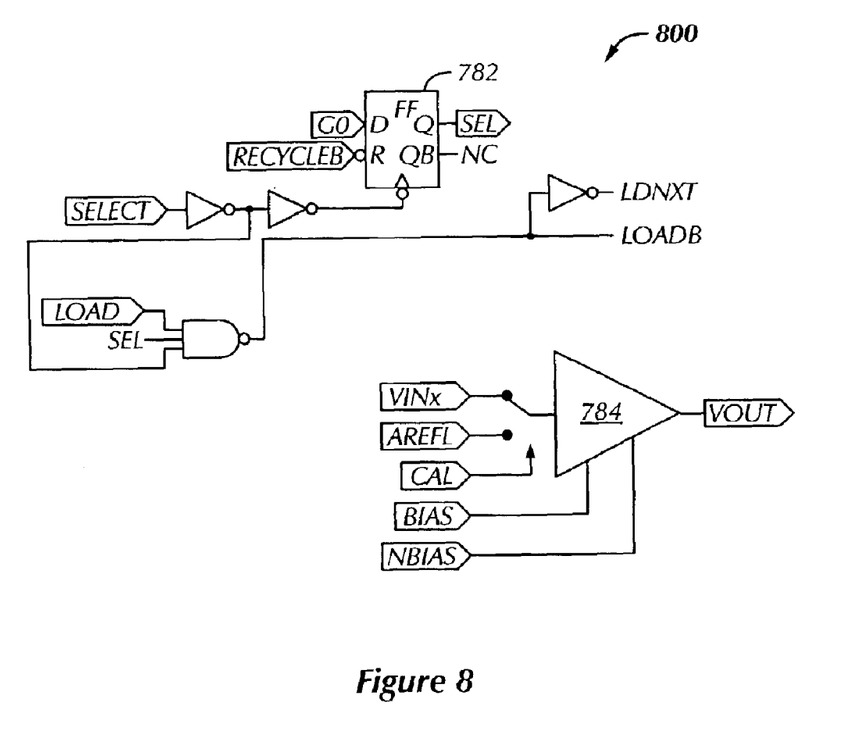
FIG. 8 shows a schematic diagram of a single ended amplifier circuit in accordance with an embodiment of the present invention.

FIG. 8 shows a schematic diagram of a single ended amplifier circuit (800) in accordance with an embodiment of the present invention. The exemplary single ended amplifier circuit (800) may be used as the amplifier circuit (302, 304) shown in FIG. 3. A calibration signal CAL may be used to allow an offset voltage potential on at least one of the plurality of sensor input signal lines (VIN1, VIN2 shown in FIG. 3) to be calibrated. The calibration signal CAL selects whether a switch circuit connects at least one of the plurality of sensor input signal lines (VIN1, VIN2 shown in FIG. 3) or a local analog reference voltage potential AREFL to the input of a single ended amplifier circuit (784).

The single ended circuit (784) outputs a VOUT signal to a subsequent stage in a channel. For example, the single ended amplifier circuit (800) may operatively connect to a filter circuit (322, 324) shown in FIG. 3.

Flip flop (782) maintains a local state for a selection circuitry. The flip flop (7822) also propagates the daisy chained SEL control signal from one amplifier circuit (302, 304, 306, 308, 310, 312) to another amplifier circuit (302, 304, 306, 308, 310, 312).

One or ordinary skill in the art will understand that the single ended amplifier circuit (800) may also include a gain control memory circuitry. For example, the single ended amplifier circuit (800) may be arranged to respond to a gain control memory circuitry similar to that shown in FIG. 5. Accordingly, a gain of the single ended amplifier circuit (800) may be adjusted and/or user controlled and selected.

Figure 9:
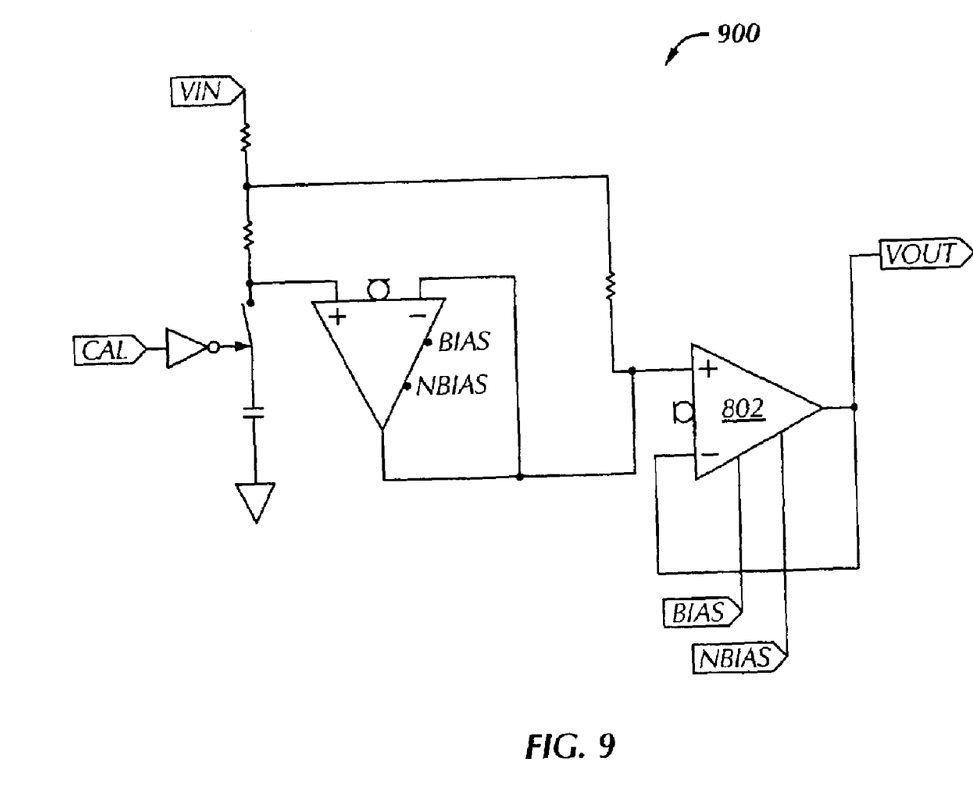
FIG. 9 shows a schematic diagram of a filter circuit in accordance with an embodiment of the present invention.

FIG. 9 shows a schematic diagram of a filter circuit (900) in accordance with an embodiment of the present invention. The exemplary filter circuit (900) may be used as the filter circuit (322, 324, 326, 328, 330, 332) shown in FIG. 3. The filter circuit (900) includes a fixed cutoff frequency filter circuit operatively connected to a unity gain operational amplifier (802). The operational amplifier (802) is operatively connected to an NBIAS signal and a BIAS signal. The BIAS signal and NBIAS signal provide a bias signal to the operational amplifier (802).

A calibration signal CAL may be used to allow an offset voltage potential on at least one of the plurality of sensor input signal lines (VIN1, VIN2, VIN3P, VIN3N, VIN4P, VIN4N, VIN5P, VIN5N, VIN6P, VIN6N shown in FIG. 3) to be calibrated.

Figure 10:
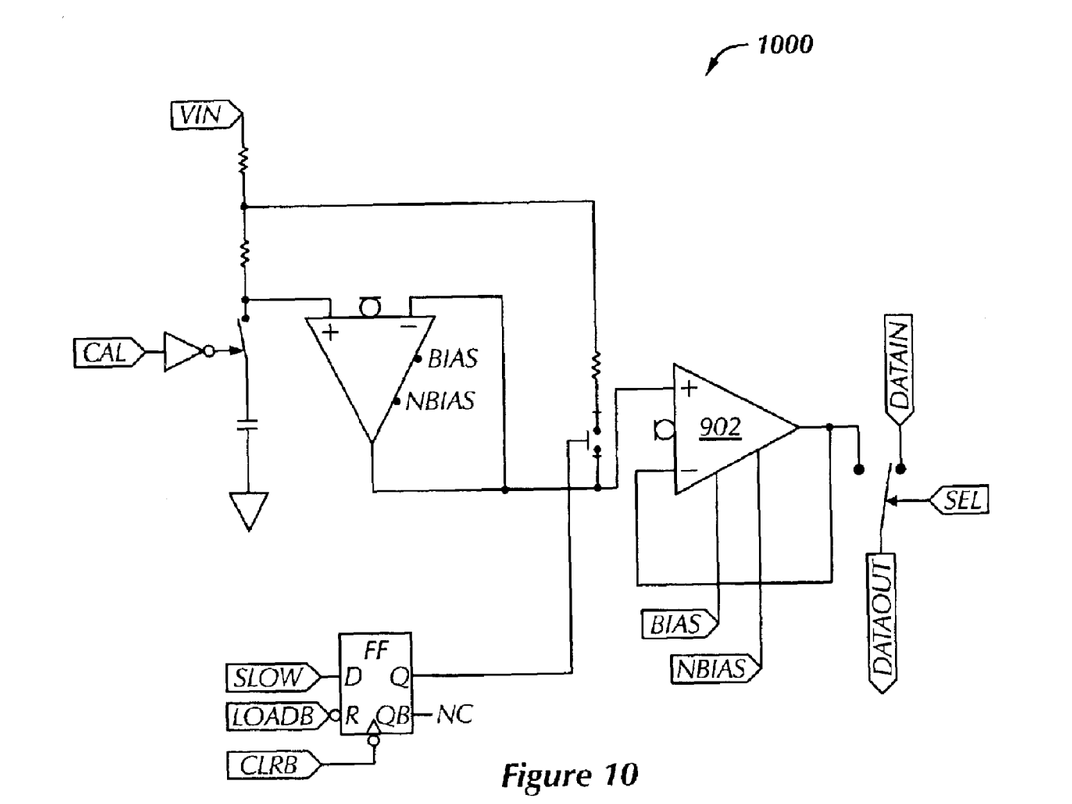
FIG. 10 shows a schematic diagram of a filter circuit with pole frequency control memory and an output multiplexing switch in accordance with an embodiment of the present invention.

FIG. 10 shows a schematic diagram of a filter circuit with pole frequency control memory and an output multiplexing switch (1000) in accordance with an embodiment of the present invention. The exemplary filter circuit with pole frequency control memory and the output multiplexing switch (1000) may be used as the filter circuit (342, 344, 346, 348, 350, 352) shown in FIG. 3. The filter circuit with pole frequency control memory and the output multiplexing switch (1000) includes a filter circuit operatively connected to a unity gain operational amplifier (902). The filter circuit has a cutoff frequency that may be switched dependent on a user command. A flip flop maintains a state of the filter circuit's cutoff frequency (i.e., pole frequency control memory).

The operational amplifier (902) is operatively connected to an NBIAS signal and a BLAS signal. The BIAS signal and NBIAS signal provide a bias signal to the operational amplifier (902). The filter circuit (1000) includes a switch circuit (i.e., output multiplexing switch) that selects between an output signal line of the operational amplifier (902) and a DATAIN signal line on which to output a signal on a DATAOUT output signal line. The DATAIN signal line may be operatively connected to another filter circuit (342, 344, 346, 348, 350, 352) shown in FIG. 3. The switch circuit is dependent on the SEL control signal, which is dependent on a user command.

A calibration signal CAL may be used to allow an offset voltage potential on at least one of the plurality of sensor input signal lines (VIN1, VIN2, VIN3P, VIN3N, VIN4P, VIN4N, VIN5P, VIN5N, VIN6P, VIN6N shown in FIG. 3) to be calibrated.

One of ordinary skill in the art, having benefit of this disclosure, will understand that a channel supports at least one sensor input signal line and the channel may include an amplifier circuit and/or a filter circuit. The amplifier circuit may be a single ended, multiple ended, or differential amplifier circuit. The amplifier circuit may have one or more stages and one or more amplifiers. Each amplifier may provide a gain, which includes a unity gain or attenuation. The filter circuit may have one or more poles and one or more stages. The filter circuit may include passive and/or active circuit elements. Furthermore, a channel may have one or more filter circuit(s) and/or one or more amplifier circuit(s) in an arrangement such that the filter circuit(s) and amplifier circuit(s) may be in any order. In other words, a filter circuit may precede an amplifier circuit, and vice versa. Also, filter circuits and amplifier circuits may be interspersed between each other and/or grouped together. Also, a multiplexing switch may be used to select a filter circuit output and/or an amplifier circuit output. Further, a multiplexer may be used to provide a "many-to-one" connection between several circuits to a single circuit.

One of ordinary skill in the art, having benefit of this disclosure, will understand that sensors may sense a vary of different physical characteristics that include, but are not limited to, temperature, weight, force, acceleration, position, radio frequency, spectrum, energy, and signals carried by any physical characteristic (e.g., a signal carried by a radio frequency). Further, an antenna may be a sensor.

One of ordinary skill in the art, having benefit of this disclosure, will understand that a control signal that controls a plurality of circuits may be daisy chained between the circuits or directly connected to the plurality of circuits. A circuit includes a group of circuit elements on an integrated circuit, an entire integrated circuit, and/or a plurality of integrated circuits. The circuits may include, but are not limited to, CMOS transistor(s), bipolar junction transistor(s), a combination of CMOS transistor(s) and bipolar junction transistor(s), gallium based transistors, other Group III-IV materials, all optical circuits, electro-optical circuits, and passive components including discrete and integrated passive components.

Advantages of the present invention may include one or more of the following. In one or more embodiments, each channel is amplified and filtered. Accordingly, delays associated with switching shared amplifier circuits and/or filter circuits is not required.

In one or more embodiments, because a daisy chained control signal line is used, fewer routing lines are required to be routed to a plurality of circuits. Accordingly, a data acquisition system may be smaller. Furthermore, more circuits may be used in a data acquisition system with a fixed size.

In one or more embodiments, because a daisy chained input signal line and output signal line are used, fewer routing lines are required to be routed to a plurality of circuits. Accordingly, a data acquisition system may be smaller. Furthermore, more circuits may be used in a data acquisition system with a fixed size.

In one or more embodiments, because data acquisition system is arranged to have a daisy chained control system and a daisy chained input signal line and output signal line, multiple similarly arranged monolithic integrated circuits may be daisy chained. Accordingly, the data acquisition system may be expandable to accommodate a desired number of sensor input signal lines.

In one or more embodiments, an analog, multiple pole filter circuit is used in contrast to a single pole filter circuit. Furthermore, at least one analog, multiple pole filter circuit is used per channel. Also, an amplifier circuit is used per channel. Accordingly, offset voltage potential calibration and gains may be user controlled and selected on a per channel basis.

In one or more embodiments, because a non-switching amplifier circuit design is used, noise is advantageously reduced. A reduced noise design, along with consideration for analog circuit effects, allows at least one of the amplifier circuits and/or at least one of the filter circuits to be auto-routed. Furthermore, in a typical analog circuit design, matching between analog circuit elements is critical for proper operation of the analog circuit. In one or more embodiments of the present invention, bias signals (e.g., BIAS, NBIAS) are transmitted as voltages. Accordingly, current mirrors, and other analog bias circuit, may be distributed across a data acquisition system. Also, parts of analog bias circuits may be split and distributed across the data acquisition system. Accordingly, it is practical that at least a part of the analog circuits may be auto-routed.

In one or more embodiments, a data acquisition system may include CMOS transistors. A manufactured size of a CMOS transistor may be relatively small. Accordingly, the data acquisition system may be relatively small or more circuits may be used in the data acquisition system with a fixed size.

In one or more embodiments, because a daisy chained control system is used, a controller does not need to know a number of channels available on each monolithic integrated circuit. If a controller simply knows a total number of channels, a single or plural number of integrated circuits may be used. Each integrated circuit may have a different number of channels. Accordingly, the control system is simplified. Furthermore, additional channels may be added with a minimum of added complexity. Also, channels that are accessed more often may be located earlier in the daisy chain to reduce the number of control pulses required to access those channels.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A data acquisition system, comprising:
    a plurality of sensor input signal lines;
    a plurality of amplifier circuits, wherein at least one of the plurality of amplifier circuits operatively connects to at least one of the plurality of sensor input signal lines; and
    a plurality of filter circuits, wherein each of the plurality of amplifier circuits operatively connects to a different one of the plurality of filter circuits, and wherein at least one of the plurality of filter circuits is an analog, multiple pole filter circuit.

2. The data acquisition system of claim 1, wherein each of the plurality of amplifier circuits operatively connects to at least one of the plurality of filter circuits.

3. The data acquisition system of claim 1, further comprising:
    an input signal line;
    a first output signal line;
    a second output signal line;
    a first switch circuit; and
    a second switch circuit,
    wherein at least one of the plurality of filter circuits operatively connects to a first filtered output signal line,
    wherein at least one of the plurality of filter circuits operatively connects to a second filtered output signal line,
    wherein the first switch circuit operatively connects the first output signal line to at least one selected from the first filtered output signal line and the input signal line, and
    wherein the second switch circuit operatively connects the second output signal line to at least one selected from the second filtered output signal line and the first output signal line.

4. The data acquisition system of claim 3, further comprising:
    a third output signal line; and
    a third switch circuit,
    wherein at least one of the plurality of filter circuits operatively connects to a third filtered output signal line, and
    wherein the third switch circuit operatively connects the third output signal line to at least one selected from the third filtered output signal line and the second output signal line.

5. The data acquisition system of claim 4, further comprising:
    a daisy chained control signal line, wherein a state of the first switch circuit, the second switch circuit, and the third switch circuit is dependent on the daisy chained control signal line.

6. The data acquisition system of claim 1, further comprising:
    a plurality of control signal lines, wherein at least one line of the plurality of control signal lines is daisy chained between at least two of the plurality of amplifier circuits.

7. The data acquisition system of claim 1, wherein one of the plurality of amplifier circuits and one of the plurality of filter circuits is auto-routed.

8. The data acquisition system of claim 1, wherein at least one of the plurality of amplifier circuits has a user selectable gain.

9. The data acquisition system of claim 1, wherein the data acquisition system is arranged to allow an offset voltage potential on at least one of the plurality of sensor input signal lines to be calibrated.

10. The data acquisition system of claim 1, wherein the data acquisition system comprises CMOS transistors.

11. A data acquisition system, comprising:
    a first integrated circuit, comprising:
        a plurality of sensor input signal lines,
        a daisy chained input control signal line,
        a daisy chained output control signal line,
        an input signal line,
        an output signal line, and
        a control signal line; and a second integrated circuit, comprising:
   a plurality of sensor input signal lines,
   a daisy chained input control signal line,
   a daisy chained output control signal line,
   an input signal line,
   an output signal line, and
   a control signal line,
wherein the daisy chained output control signal line of the first integrated circuit operatively connects to the daisy chained input control signal line of the second integrated circuit,
wherein the output signal line of the second integrated circuit operatively connects to the input signal line of the first integrated circuit,
wherein the control signal line operatively connects to both the first integrated circuit and the second integrated circuit, and
wherein the input signal line of the first integrated circuit is responsive to at least one of the plurality of sensor input signal lines of the second integrated circuit dependent on the daisy chained output control signal line of the first integrated circuit.

12. The data acquisition system of claim 11, wherein the first integrated circuit and the second integrated circuit comprise CMOS transistors.

13. The data acquisition system of claim 11, the first integrated circuit and the second integrated circuit, further comprise:
   an amplifier circuit, wherein the amplifier circuit operatively connects to at least one of the plurality of sensor input signal lines; and
   a filter circuit, wherein the filter circuit is an analog, multiple pole filter circuit, and wherein the filter circuit operatively connects to the amplifier circuit.

14. The data acquisition system of claim 13, wherein the amplifier circuit has a user selectable gain, and wherein a gain of the amplifier circuit is dependent on the control signal line.

15. A method of acquiring data, comprising:
   inputting a plurality of sensor signals;
   amplifying the plurality of sensor signals to produce a plurality of amplified sensor signals;
   filtering the plurality of amplified sensor signals, wherein the filtering uses a plurality of analog, multiple pole filter circuits, and wherein the filtering produces a first filtered, amplified sensor signal, a second filtered, amplified sensor signal, and a third filtered, amplified sensor signal;
   a first selecting between the first filtered, amplified sensor signal and an input signal dispose on an integrated circuit input signal line to output a first output signal;
   a second selecting between the second filtered, amplified sensor signal and a first signal dependent on the first output signal to output a second output signal;
   a third selecting between the third filtered, amplified sensor signals and a second signal dependent on the second output signal to output a third output signal; and
   operatively connecting the third output signal to an integrated circuit output signal line.

16. The method of acquiring data of claim 15, further comprising:
   controlling the first selecting, the second selecting, and the third selecting dependent on a user command.

17. The method of acquiring data of claim 16, wherein the controlling is dependent on a number of digital pulses.

18. The method of acquiring data of claim 15, further comprising:
   controlling a gain of the amplifying dependent on a user command.

19. The method of acquiring data of claim 18, wherein the controlling is dependent on a number of digital pulses.

20. The method of acquiring data of claim 15, further comprising:
   calibrating an offset voltage potential of at least one of the plurality of sensor signals dependent on a user command.

21. A data acquisition system, comprising:
   means for inputting a plurality of sensor signals;
   means for amplifying the plurality of sensor signals to produce a plurality of amplified sensor signals;
   means for filtering the plurality of amplified sensor signals to produce a plurality of filtered, amplified sensor signals;
   means for selecting one of the plurality of filtered, amplified sensor signals from a first integrated circuit to produce a selected filtered, amplified sensor signal;
   means for daisy chaining the selected filtered, amplified sensor signal to a second integrated circuit; and
   means for outputting the selected filtered, amplified sensor signal from the second integrated circuit.

22. A data acquisition system, comprising:
   a first integrated circuit, comprising:
      means for inputting a sensor signal for at least three channels; and
      a plurality of means for filtering at least three channels, each of the at least three channels corresponding with a different one of the plurality of means for filtering, and wherein each of the plurality of means for filtering comprises one or more poles.

23. The data acquisition system of claim 22, further comprising:
   means for amplifying each of the at least three channels.

24. The data acquisition system of claim 22, further comprising:
   a second integrated circuit, wherein the second integrated circuit is dependent on a daisy chained control signal line output by the first integrated circuit.

* * * * *